United States Patent [19]
Henley

[11] Patent Number: 5,124,635
[45] Date of Patent: Jun. 23, 1992

[54] VOLTAGE IMAGING SYSTEM USING ELECTRO-OPTICS

[75] Inventor: Francois J. Henley, Los Gatos, Calif.

[73] Assignee: Photon Dynamics, Inc., San Jose, Calif.

[21] Appl. No.: 654,709

[22] Filed: Feb. 13, 1991

Related U.S. Application Data

[63] Continuation-in-part of Ser. No. 582,577, Sep. 13, 1990, which is a continuation-in-part of Ser. No. 481,429, Feb. 15, 1990, Pat. No. 4,983,911.

[51] Int. Cl.$^5$ .................... G01R 31/28; G01B 9/02
[52] U.S. Cl. .................... 324/96; 324/73.1; 324/158 R; 324/158 D; 356/364
[58] Field of Search ............. 324/96, 158 R, 158 D, 324/73.1; 350/356, 374, 376; 356/364, 367, 368, 2, 397; 382/8; 437/8

[56] References Cited

U.S. PATENT DOCUMENTS

| | | | |
|---|---|---|---|
| 4,229,073 | 10/1980 | Lotspeich | 350/389 |
| 4,242,635 | 12/1980 | Burns | 324/158 R |
| 4,355,278 | 10/1982 | Burns et al. | 324/158 R |
| 4,465,969 | 8/1984 | Tada et al. | 324/96 |
| 4,523,847 | 6/1985 | Bjorklund et al. | 356/364 |
| 4,563,093 | 1/1986 | Tada et al. | 356/368 |
| 4,618,819 | 10/1986 | Mourou et al. | 324/158 R |
| 4,758,092 | 7/1988 | Heinrich et al. | 324/158 R |
| 4,776,022 | 10/1988 | Fox et al. | 382/8 |
| 4,855,591 | 8/1989 | Nakamura et al. | 250/225 |
| 4,862,075 | 8/1989 | Choi | 324/158 |
| 4,868,492 | 9/1989 | Beha et al. | 324/158 R |
| 4,875,006 | 10/1989 | Henley et al. | 324/158 D |
| 4,906,922 | 3/1990 | Takahashi et al. | 324/96 |
| 4,910,458 | 3/1990 | Forsyth et al. | 324/158 R |
| 4,919,522 | 4/1990 | Nelson | 350/389 |
| 4,983,911 | 1/1991 | Henley | 324/158 R |
| 4,999,577 | 3/1991 | Beha et al. | 324/158 R |
| 5,034,683 | 7/1991 | Takahashi et al. | 324/158 R |

*Primary Examiner*—Vinh Nguyen
*Attorney, Agent, or Firm*—Townsend and Townsend

[57] ABSTRACT

A two-dimensional image of the voltage distribution across a surface at a large plurality voltage test points of a panel under test is extracted by illuminating the surface with an input beam of optical energy through an electro-optic modulator wherein the modulator is disposed to allow longitudinal probing geometries such that a voltage differential on the surface of the panel under test causes a power modulation in the optical energy which can be observed through an area optical sensor (a camera) for use to directly produce a two-dimensional spatially-dependent power modulation image directly representative of the spatially corresponding differential voltage state on the surface of the panel under test. Surface cross-talk is minimized by placing the face of the modulator closer to the panel under test than the spacing of voltage sites in the panel under test. The device may operate in a pass-through mode or in a reflective mode.

20 Claims, 3 Drawing Sheets

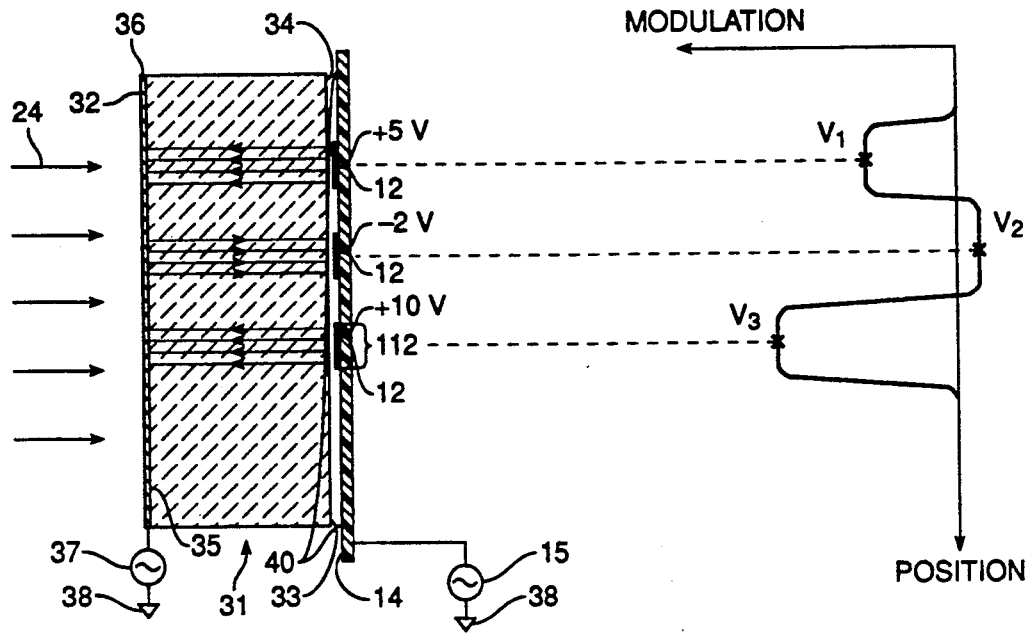
FIG. 3                    FIG. 4
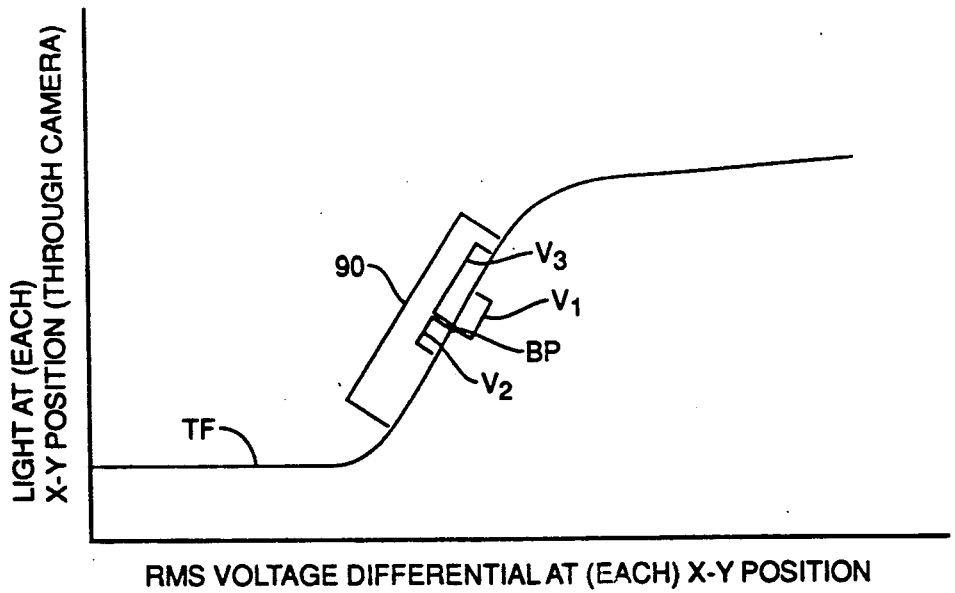
FIG. 5

VOLTAGE IMAGING SYSTEM USING ELECTRO-OPTICS

CROSS REFERENCE TO RELATED APPLICATION

This application is a continuation-in-part of copending U.S. patent application Ser. No. 07/582,577, filed Sep. 13, 1990, which is a continuation-in-part of U.S. patent application Ser. No. 07/481,429 filed Feb. 15, 1990, now U.S. Pat. No. 4,983,911, issued Jan. 8, 1991, for VOLTAGE IMAGING SYSTEM USING ELECTRO-OPTICS.

BACKGROUND OF THE INVENTION

This invention relates to electro-optic sensing of voltage, and more particularly, to electro-optic sensing of voltage as a function of position of a large plurality of voltage sources on a surface.

There is a growing need to be able to test and extract voltage information from a voltage-producing surface such as a printed circuit board, an integrated circuit wafer (with or without a package) or a liquid crystal display panel in order to diagnose the integrity of the structure. The present electronic test systems have a technology capable of testing circuit boards or panels (a panel under test or PUT) having a node density not exceeding approximately 100 nodes per square inch.

Certain applications, such as the testing of liquid crystal display panels are best practiced with non-contact sensing techniques such as electro-optic techniques. However, these panels have conductive pixels such as transparent indium tin oxide (ITO), with a thin-film transistor deposited directly on the glass surface and are therefore, considered very fragile. Such panels also may have an additional insulating layer covering the deposited structure, rendering it impossible to place voltage probes at selected positions on the panel. It is therefore impractical to impose contact testing on such panels. Nevertheless, current and projected production methods and strategies demand that each pixel of such a panel be tested for its ability to change voltage state as well an ability to measure voltage under various conditions relative to their voltages. The current state of the art does not provide a test technique for such structures.

It is known to use electro-optic devices for serially testing selected nodes of a voltage producing device. Reference is made to U.S. Pat. Nos. 4,875,006 and 4,862,075. The subject matter of those patents is incorporated herein and made a part hereof. Therein, the use of a single light beam is described to serially access individual sensor nodes using a unique sensor/laser arrangement giving control over a beam of light whereby a Pockels Cell Modulator employs the electrooptic Pockels effect to sense local electric fields produced by voltage on a surface. Such known devices require control of a beam by scanning technology such as an acoustic-optic deflector or an x-y stage. Known systems are thus limited to single beam, serial data extraction.

SUMMARY OF THE INVENTION

According to the invention, a two-dimensional image of the voltage distribution across a surface at a large plurality of voltage test points of a panel under test is extracted by illuminating the surface with an input beam of optical energy through an electro-optic light modulating means such as an NCAP modulator or other liquid dispersed polymer-based devices, wherein the light modulator is disposed to allow longitudinal probing geometries such that a voltage differential on the surface of the panel under test causes a power modulation in the optical energy which can be observed through an area optical sensor (such as a camera) for use to directly produce a two-dimensional spatially-dependent power modulation image directly representative of the spatially corresponding differential voltage state on the surface of the panel under test. Surface cross-talk is minimized by placing the face of the light modulator closer to the panel under test than the spacing of voltage sites in the panel under test. The device may operate in a pass-through mode or in a reflective mode. In a pass-through mode, the image is sensed through a transparent panel under test. In a reflective mode, light power is observed upon two-pass reflection through the electro-optic light modulator. A camera or other imaging sensor can be used as an instrument to detect the spatial image.

An apparatus operating in accordance with the method of the invention includes an optical energy source, such as a laser, an electro-optic sensor (light modulator) exhibiting an electro-optic effect, such as the light scattering effect present in NCAP (nematic curvilinear aligned phase) or PDLC (polymer dispersed liquid crystal) films, when placed in close proximity to the panel under test, and means for spatially observing a spatially-modulated light beam.

The invention has particular application to noninvasive testing of high-density integrated circuits and testing liquid crystal display (LCD) panels prior to connection with electrical interfaces.

The invention will be better understood by reference to the following detailed description in connection with the accompanying drawings.

BRIEF DESCRIPTION OF THE DRAWINGS

FIG. 3 is a side cross-sectional view of an electro-optic crystal adjacent a panel under test.

FIG. 4 is a graph of an illustrative voltage spatial distribution in connection with FIG. 3.

FIG. 5 is a graph of an illustrative voltage/light transfer function.

DESCRIPTION OF SPECIFIC EMBODIMENTS

Figure 1:
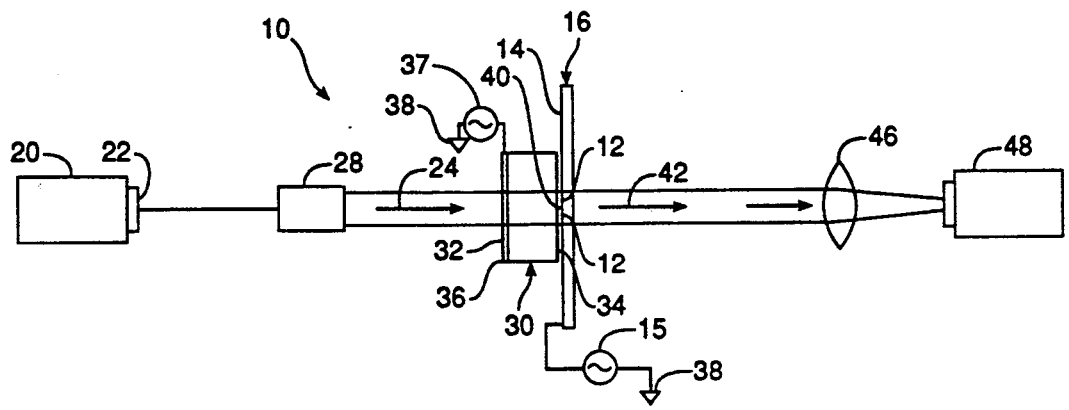
FIG. 1 is a block diagram of a first embodiment of the invention.
Figure 2:
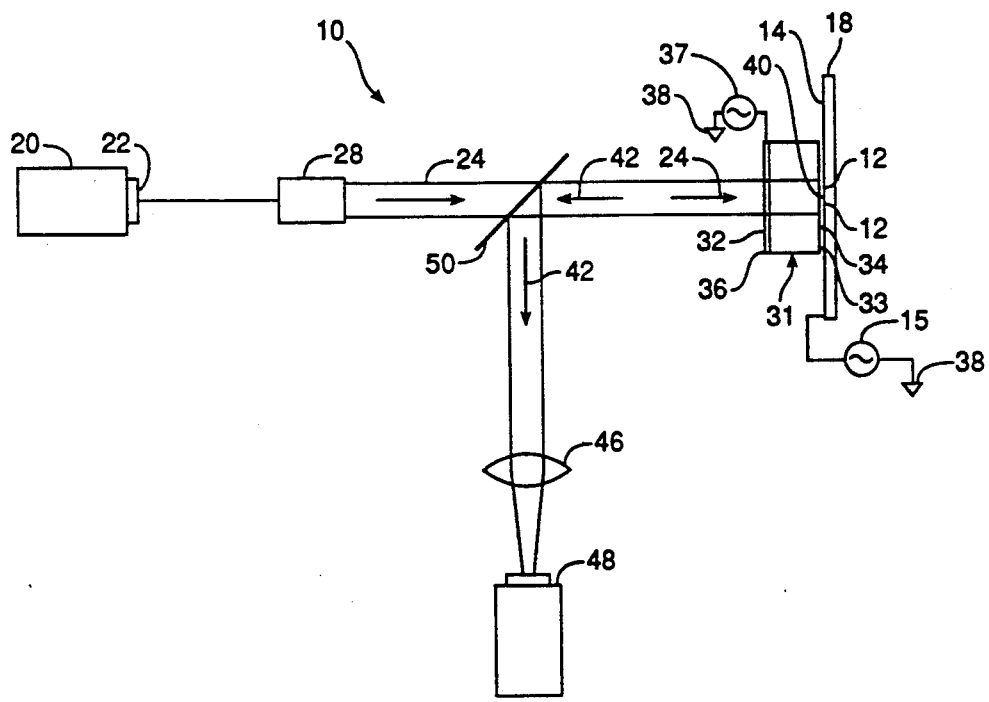
FIG. 2 is a block diagram of a second embodiment of the invention.

FIGS. 1 and 2 illustrate two embodiments of a voltage imaging system 10 or 10' for observing voltage at a large plurality of positions 12 on a surface 14 of a panel under test (PUT) 14 or 16. FIG. 3 illustrates a detail of a portion of the system 10. The PUT 14 is a panel transparent to optical energy at the wavelengths of interest and the PUT 16 is a panel which may be opaque to optical energy. The PUT 14 may be a silicon chip or the like and the PUT 16 may be a liquid crystal display (LCD) panel. In any case, the PUT 14 or 16 may be connected in some way to a source of power (not shown) in order to produce voltages at selected sites on the surface of the panel 14 or 16.

In order to probe the voltage, there is first a source 20 of optical energy, such as a xenon, sodium, or quartz halogen lamp, a pulsed or continuous LED, laser or the like. The source optical energy is channeled into a source beam 22 and processed to produce an optical input beam 24 which may expanded and collimated with a beam expander 28. For this purpose, there may be provided a lens, mirror or fiber optic system 28 to expand and collimate the source beam into the input beam 24. The collimated input beam preferably has a constant or at least known power density cross-section.

The input beam is directed into an electro-optic modulator means 30 or 31 of a specific type, structure and possibly atomic or molecular axis orientation. A suitable modulator 30 may be a modulator fabricated with an NCAP or PDLC film. This power modulator 30 utilizes the light scattering properties of liquid crystal droplets encapsulated in a polymer matrix. The encapsulation structure produces a curvilinear alignment of the liquid crystal molecules, and this aligned phase can be optically switched by a controlled electric field as desired. The device is therefore switched from a highly light scattering state to a highly transmissive state. Biasing the device between the two states allows the modulator to exhibit a roughly linear light to voltage transfer function. The electro-optic modulator means 30 has a first face 32 and an opposing second face 34 to allow longitudinal probing geometries, as explained hereinafter. The first face 32 has a conductive coating 36 which is transparent, such as indium tin oxide (ITO), and which is electrically coupled through a bias element 37 to a voltage common 38, such as ground. The bias element 37 may provide either a fixed or variable voltage to establish a voltage differential relative to a testing voltage, as applied to the PUT 14, as hereinafter explained. The second face 34 of modulator means 30 (FIG. 1) is transparent to permit transmission of the input beam through the PUT 16. The second face 34 of modulator means 31 (FIG. 2) has a highly-reflective nonconductive coating 33, which produces a retro-reflection of the input beam 24. The second face 34 is disposed to be adjacent an area 40 of the surface 14 of the PUT 16 or 18. The modulator means 30 is oriented to intercept at least a portion of the input beam 24 directed into the modulator through the first face 32 to impinge on the second face 34 at a position of the modulator means 30 or 31 closely adjacent the area 40 of the surface 14 of the PUT 16 or 18. An excitation voltage source 15 is coupled to conductors on the PUT 16 or 18 to provide a source of variable voltage to the PUT at positions 12. Thus the bias function and the excitation function are separated and distributed among source 37 and source 15. The voltages at positions 12 at or near the surface 14 interact with the modulator means 30 to cause changes in the optical power transmission of the input beam 24 in alignment with positions 12 of voltages. This is observable as a spatially-dependent change in collimated alignment of an output beam 42 with the input beam 24, the changes being proportional to voltages at the positions 12 on the surface 14.

FIG. 4 illustrates the interaction between a PUT 18 and a modulator means 31 of a type having a reflective coating 33 on the second face 34. The reflective coating may be a dielectric coating or stack of dielectric material, and an air, solid or liquid gap is presumed to exist between the second face 34 and the surface 14. In operation, the electric field (E-field) of each position 12 penetrates the modulator means 31 causing a change in the scattering or absorption properties of the light beam, preferably in collimated alignment with every position 12 in direct and accurate proportion to the voltage at the positions 12. Voltage V1 (a time-dependent differential voltage change from the optimum bias point on the transfer function curve of the modulator 31) causes a positive change in power modulation. Voltage V2 causes a negative change (relative to the arbitrary choice of polarity) in power modulation. Voltage V3 causes a positive and extreme change in power modulation. Assuming other factors to be equal, the power modulation is a function of position and is directly proportional to the voltage differential between the surface 14 and the biased level of conductive coating 36 on the first face of the modulator 31 electrically coupled to the bias source 37. There are thus two potentially-variable voltage sources, both synchronized so the optical sensor views only an image as a result of a differential voltage through the electro-optic modulator 31 (or 30). The beam exiting the modulator 31, which in this example has made two passes through the modulator, therefore contains spatially modulated light power which carries information regarding the voltage at each point 12 relative to the voltage reference of coating 36.

FIG. 5 is a graphical illustration of the relationship between the light of each pixel received at a camera sensor 48 as a function of the RMS voltage differential generated between voltage sources 15 and 37 across the modulator means 31. A bias point BP has been selected in the modulation transfer function TF in a quasi-linear region 90 to maximize voltage versus light variation. The voltage V1 is measured relative to the bias point BP, as is the voltage V2 and the voltage V3.

Figure 6:
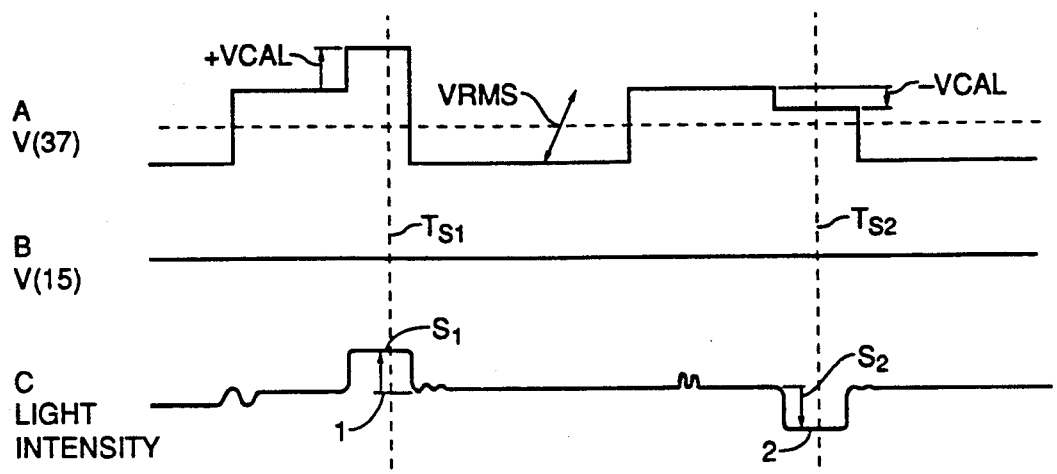
FIG. 6 is a graph for illustrating a voltage/light calibration procedure.

It is desirable to calibrate each pixel of a voltage image so that the resultant image is quantitatively representative of voltages at each pixel. FIG. 6 is useful for illustrating an example of one calibration procedure. In plot A, a voltage in the form of, for example, a square wave is initially applied by source 37, which results in an RMS voltage VRMS. (The source voltage may in general be of any reproducible waveform.) The voltage VRMS is used to set the bias point BP (FIG. 5). A secondary calibration voltage +VCAL, a squared pulse or other reproducible waveform, is additively combined with the source voltage square wave at a portion of the duty cycle following the applied square wave voltage and sufficiently ahead of the transition of the square wave voltage to allow the modulator 31 to settle to a quasisteady state. (The length of the calibration voltage pulse is about 2 ms, corresponding to the settling time of the material.) At a point in time $T_{S1}$, a sample of the image is captured and stored through a camera. (One LCD pixel may be captured or viewed by a plurality of camera pixels). A second sample is captured at a subsequent sample time $T_{S2}$, when the square wave voltage is either at its nominal value or when it is biased by a second calibration voltage such as −VCAL. At the point in time $T_{S2}$, a sample of the image is also captured and stored through the camera. The light intensities corresponding to points 1 and 2 ($S_1$ and $S_2$) are thereafter compared as a function of the differential of corresponding calibration voltages to determine gain. Gain is a function of spacing, voltage, reflection efficiency of the dielectric mirror stack and localized intrinsic gain of the material of the modulator 31. The gain is given by:

GAIN=(ΔVCAL)/(S$_2$−S$_1$) at each measurement position.

Image processing can perform this gain calibration function for all points simultaneously on a captured image. Thereafter, any voltage can be quantified by measurement of a differential voltage relative to VRMS, which is the bias point BP.

Figure 7:
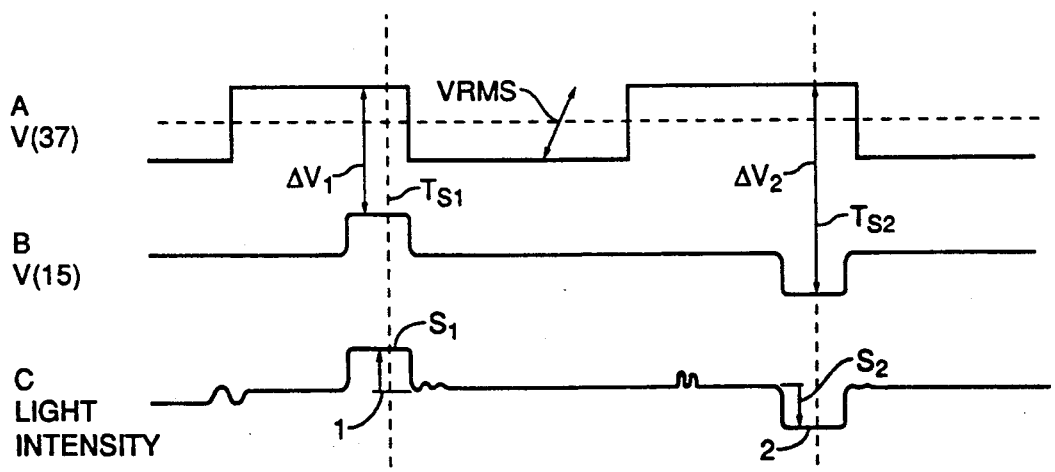
FIG. 7 is a graph for illustrating a calibrated voltage measurement.

Referring to FIG. 7, measurements relative to the bias point may be made by consecutive samples of the light intensity. There is first a sampling of the light intensity at a point 1 to obtain a sample S$_1$ while the bias source 37 is at a (positive) stable voltage and the excitation voltage source 15 applying a voltage across the PUT 31 is at a (positive) stable voltage. There follows a sampling of the light intensity at a point 2 to obtain a sample S$_2$ while the bias source 37 is at a (positive) stable voltage and the excitation voltage source 15 applying a voltage across the PUT 31 is at a (negative) stable voltage. The differential between the voltages applied through sources 15 and 37 is ΔV$_1$ at point 1 and ΔV$_2$ at point 2.

The unknown voltage, namely, the measured voltage at an arbitrary panel pixel XY, or ΔV$_{1-2}$=GAIN (S$_2$−S$_1$). This differential, to a first order, eliminates offset errors. Where one of the sample measurements is relative to a circuit ground, measured voltage will be equal to the unknown voltage.

The separation between the second face 34 and the surface 14 are controlled, preferably being as close as practical without causing side effects, such as shorts, thermal transfer or mechanical distortion due to stress. The selection of the spacing is made to maximize the ratio of signal to noise, particularly noise attributable to cross-talk from electric fields produced by adjacent points of voltage. A working rule, applicable particularly to LCD panels wherein the source of voltage is an area defined as a pixel area (112 in FIG. 4), is to place the second face 34 of the modulator relative to the surface 14 at less than the distance between positions 12 and preferably no more than 30% of the diameter of the pixel area. The separation may be controlled by a mechanical positioner, such as a movable table arrangement (not shown).

In order to extract that information, means are provided for detecting the change in modulation in the image across the output beam 42 to analyze the voltages. Referring to FIGS. 1 and 2, the detectors may comprise means such as a sensitive camera 48 receiving light through for example a focussing lens 46, which intercepts the spatially-dependent power modulation for producing, as seen by the camera, an observable map in two dimensions having features corresponding to voltage magnitude. Additionally, image processing can be used to enhance the ratio of signal to noise through manipulation in digitized format of the image captured by the camera 48. (Digital image manipulation is a known technique.)

In a single pass system, as shown in FIG. 1, imaging is in line. In a multiple pass system, as shown in FIG. 2, sensitivity may be enhanced by passing the beam through the modulator twice. The output beam 42 is separated from the collinear input beam 24 by means of a beam splitter 50. As a still further alternative, the input beam and the output beam can be separated by orienting the reflective surface 33 of the phase modulator 31 so that it is not perpendicular to the incident radiation. The output beam 42 is thus separated upon reflection, and a beam splitter is not needed.

The invention has now been described with reference to specific embodiments. Other embodiments will be apparent to those of ordinary skill in the art. For example, multiquantum well electro-absorption modulators may be used. It is therefore not intended that this invention be limited, except as indicated in the appended claims.

What is claimed is:

1. An apparatus for observing voltage at a large plurality of positions on a surface of a panel under test comprising:
   means for producing optical energy;
   means for directing said optical energy into an input beam of any polerization state;
   an electro-optic modulator means, said electro-optic modulator means having a first face and an opposing second face in an orientation to allow longitudinal probing geometries, said first face having a conductive coating electrically coupled to a voltage reference means for biasing said electro-optic modulator means and said second face being disposed to be adjacent an area of said surface of said panel under test, said panel under test being coupled to an excitation voltage means for applying voltages to selected portions of the panel under test, said modulator means being oriented to intercept at least a portion of said input beam directed into said modulator means through said first face to impinge on said second face adjacent said area of said surface in order to cause in an output beam spatiallydependent modulation along said input beam, said modulation being proportional to differences between voltages produced by the voltage reference means and the excitation voltage means at position on said surface; and
   means for detecting said modulation in an image across said output beam.

2. The apparatus according to claim 1 wherein said electro-optic modulator means is transmissive of said output beam through said surface and said surface is transmissive of said output beam such that optical energy passes only once through said electro-optic modulator means.

3. The apparatus according to claim 1 wherein said second face of said electro-optic modulator means has an optically reflective coating such that said input beam and said output beam each pass through said electro-optic modulator means, further including means for separating said output beam from said input beam.

4. The apparatus according to claim 3 wherein said input beam and said output beam are collinear, and said separating means is a beam splitter.

5. The apparatus according to claim 1 wherein separations between said positions are greater than separation between said surface and said second face in order to minimize cross-talk between electric fields produced by said differences between voltages at said positions.

6. The apparatus according to claim 1 wherein said modulation is power modulation and wherein said detecting means comprises:
   means for producing an observable map having features corresponding to magnitude of said differences between voltages.

7. The apparatus according to claim 6 wherein said map producing means is a camera.

8. The apparatus according to claim 1 wherein said electro-optic modulation means is a crystal.

9. The apparatus according to claim 1 wherein said electro-optic modulation means is a liquid crystal.

10. The apparatus according to claim 9 wherein said second face of said electro-optic modulator means has an optically reflective coating such that said input beam and said output beam each pass through said electro-optic modulator means, further including means for separating said output beam from said input beam and wherein said separating means is a beam splitter for splitting optical energy.

11. The apparatus according to claim 9 wherein separations between said positions are greater than separation between said surface and said second face in order to minimize cross-talk between electric fields produced by said differences between voltages at said positions.

12. The apparatus according to claim 1 wherein said electro-optic modulation means is a polymer-dispersed liquid crystal.

13. The apparatus according to claim 1 wherein said electro-optic modulation means is a solid crystal.

14. An apparatus for simultaneously observing differences between voltages produced by a voltage reference means and by an excitation voltage means at a plurality of positions on a surface of a panel under test comprising:
a light source for producing optical energy;
an electro-optic modulator means, said electro-optic modulator means having a first face and an opposing second face in an orientation to allow longitudinal probing geometries, said firs face having a conductive coating electrically coup led to the voltage reference means for biasing said electro-optic modulator means and said second face being disposed to be adjacent an area of said surface of said panel under test, said panel under test being coupled to the excitation voltage means for applying voltages to selected portions of the panel under test, said modulator means being oriented to intercept at least a portion of said input beam directed into said modulator means through said first face to impinge on said second face adjacent said area of said surface in order to cause in an output beam spatially-dependent change in light power along said input beam, said change in light power being proportional to differences between voltages produced by the voltage reference means and the excitation voltage means at positions on said surface; and
means disposed to intercept said spatiallydependent power modulation for producing an observable map having features corresponding to magnitude of said differences between voltages.

15. The apparatus according to claim 14 wherein said electro-optic modulator means is transmissive of said output beam through said surface and said surface is transmissive of said output beam such that optical energy passes only once through said electro-optic modulator means.

16. A method for observing voltage differentials at a large plurality of positions on a surface of a panel under test comprising:
directing an input beam of optical energy into an electro-optic modulator means, said electro-optic modulator means having a first face and an opposing second face in an orientation to allow longitudinal probing geometries, said first face having a conductive coating electrically coupled to a voltage reference means and said second face being disposed to be adjacent an area of said surface of said panel under test, said panel under test being coupled to the excitation voltage means for applying voltages to selected portions of the panel under test, said electro-optic modulator means being oriented to intercept at least a portion of said input beam directed into said modulator means through said first face to said second face adjacent said area of said surface of said panel under test in order to cause in an output beam a spatially-dependent modulation along said input beam, said modulation being proportional to differences between voltages produced by the voltage reference means and the excitation voltage means at positions on said surface; and
detecting said modulation in an image across said output beam.

17. The method according to claim 16 wherein said modulation is power modulation and wherein said detecting step comprises:
producing from said spatially-dependent power modulation an observable map having features corresponding to magnitude of said differences between voltages.

18. The method according to claim 16 further including the step of calibrating a voltage image for use in obtaining quantitative calibrated voltage information from said spatially-dependent power modulation in an observable map having features corresponding to a magnitude of said differences between voltages.

19. An apparatus for observing voltage at a large plurality of positions on a surface of a panel under test comprising:
means for producing optical energy;
means for directing said optical energy into an input beam of any polarization state;
an electro-optic modulator means, said electro-optic modulator means having a first face and an opposing second face in an orientation to allow longitudinal probing geometries, said first face having a conductive coating electrically coupled to a voltage reference means for producing a time-varying voltage to bias said electro-optic modulator means and said second face being disposed to be adjacent an area of said surface of said panel under test, said panel under test being coupled to an excitation voltage means for applying voltages to selected portions of the panel under test, said modulator means being oriented to intercept at least a portion of said input beam directed into said modulator means through said first face to impinge on said second face adjacent said area of said surface in order to cause in an output beam spatially-dependent modulation along said input beam, said modulation being proportional to differences between voltages produced by the voltage reference means and the excitation voltage means at positions on said surface; and
means for detecting said modulation in an image across said output beam.

20. A method for observing voltage differentials at a large plurality of positions on a surface of a panel under test comprising:
directing an input beam of optical energy into an electro-optic modulator means, said electro-optic modulator means having a first face and an opposing second face in an orientation to allow longitudinal probing geometries, said first face having a conductive coating electrically coupled to a voltage reference means and said second face being disposed to be adjacent an area of said surface of said panel under test, said panel under test being coupled to the excitation voltage means for applying voltages to selected portions of the panel under test, said electro-optic modulator means being oriented to intercept at least a portion of said input beam directed into said modulator means through said first face to said second face adjacent said area of said surface of said panel under test in order to cause in an output beam a spatially-dependent modulation along said input beam, said modulation being proportional to differences between voltages produced by the voltage reference means and the excitation voltage means at positions on said surface; and detecting said modulation in an image across said output beam.

* * * * *